(12) United States Patent
Han

(10) Patent No.: US 7,534,643 B2
(45) Date of Patent: May 19, 2009

(54) CMOS IMAGE SENSOR AND METHOD FOR FABRICATING THE SAME

(75) Inventor: Chang Hun Han, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 63 days.

(21) Appl. No.: 11/448,496

(22) Filed: Jun. 7, 2006

(65) Prior Publication Data
US 2006/0273321 A1    Dec. 7, 2006

(30) Foreign Application Priority Data
Jun. 7, 2005    (KR)    ............... 10-2005-0048482

(51) Int. Cl.
*H01L 21/00*    (2006.01)
(52) U.S. Cl. ......................... 438/60; 257/772
(58) Field of Classification Search ................ 438/153, 438/188, 199–233, 48, 60; 257/204, 274, 257/292, 772
See application file for complete search history.

(56) References Cited
U.S. PATENT DOCUMENTS
6,180,535 B1 * 1/2001 Wu et al. ............... 438/734

2004/0046193 A1 * 3/2004 Park et al. ............... 257/292
2006/0121640 A1 * 6/2006 Kim ............................ 438/57

* cited by examiner

*Primary Examiner*—W. David Coleman
*Assistant Examiner*—Sonya D McCall Shepard
(74) *Attorney, Agent, or Firm*—Saliwanchik, Lloyd & Saliwanchik

(57) ABSTRACT

A method for fabricating a CMOS image sensor includes: forming a gate electrode on a pixel region of the semiconductor substrate and, at the same time, forming a polysilicon pattern on a middle resistor region; forming a first lightly doped n-type diffusion region on the photodiode region; forming a second lightly doped n-type diffusion region on the transistor region; consecutively forming first and second insulating layers on the entire surface of the semiconductor substrate; removing a predetermined portion of the second insulation layer on the transistor region and the middle resistor region; forming a third insulation layer on the entire surface of the semiconductor substrate; forming sidewalls of the first insulating layer and the third insulating layer on the gate electrode and the polysilicon pattern by performing an etch-back process; and heavily doping n-type impurities in the transistor region and the polysilicon pattern.

18 Claims, 14 Drawing Sheets

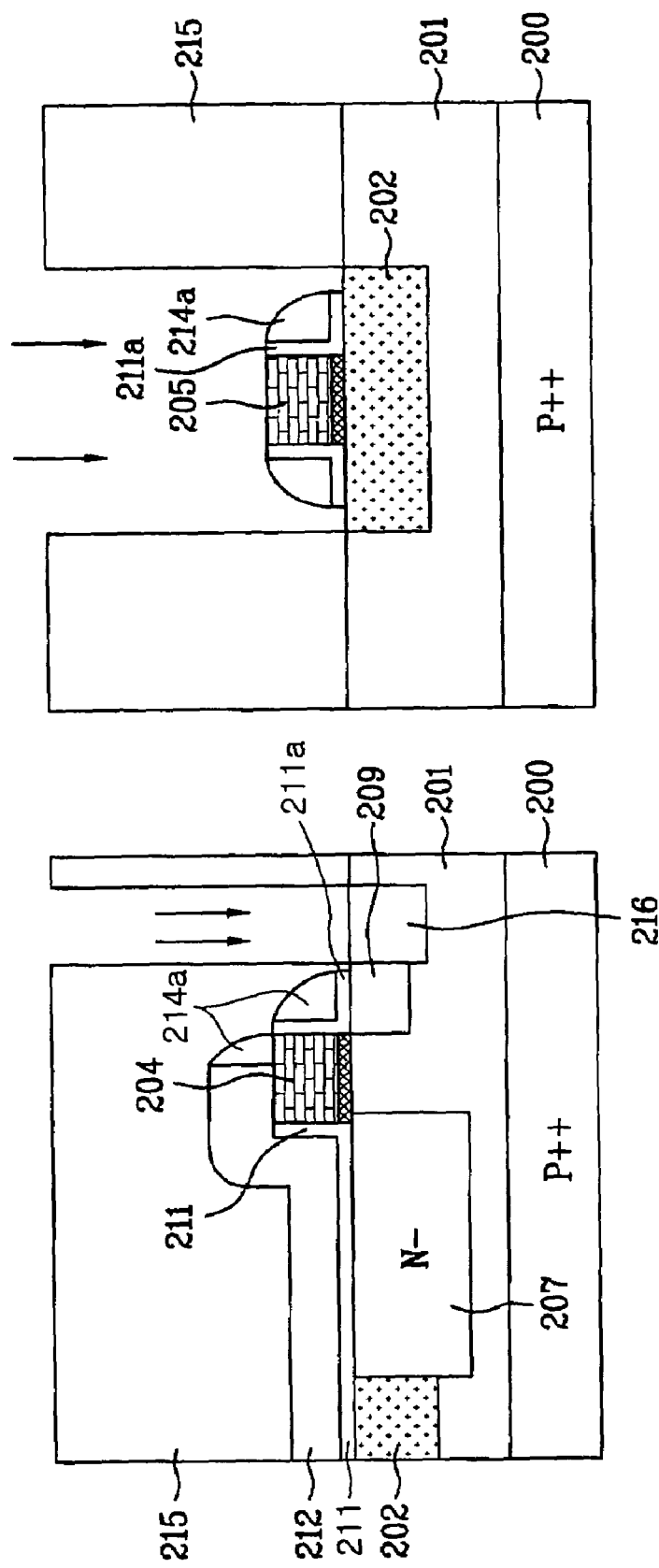

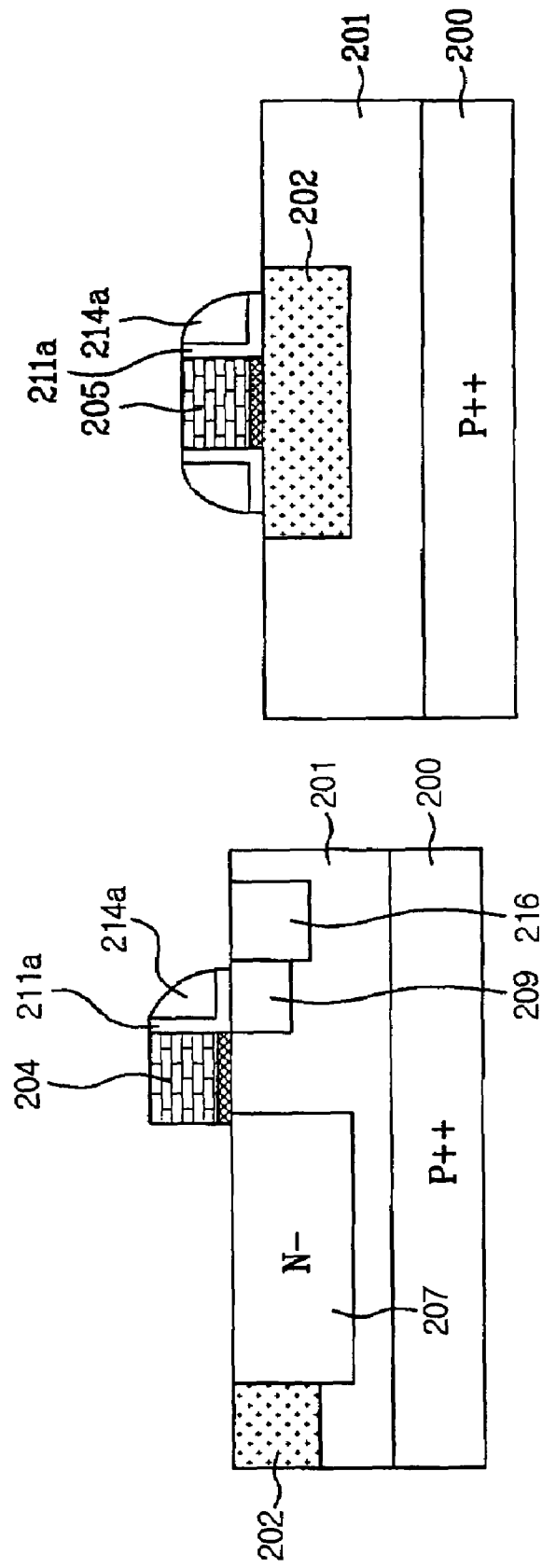

CMOS IMAGE SENSOR AND METHOD FOR FABRICATING THE SAME

RELATED APPLICATION

This application claims the benefit, under 35 U.S.C. §119 (e), of Korean Patent Application No. 10-2005-0048482, filed Jun. 7, 2005, which is incorporated herein by reference in its entirety.

FIELD OF THE INVENTION

The present invention relates to a CMOS image sensor and a method for fabricating the same, and more particularly, to a method of fabricating a CMOS image sensor, which can improve a property of the CMOS image sensor by reducing a dark current and a resistance variation of a middle resistor poly, and a CMOS image sensor fabricated by such a method.

BACKGROUND OF THE INVENTION

Generally, an image sensor is a semiconductor device that converts an optical image to an electric signal. An image sensor can be classified as a charge coupled device (CCD) or a complementary metal oxide silicon (CMOS) image sensor.

The CCD includes a plurality of photo diodes converting an optical signal into an electric signal that are arranged in a matrix pattern, a plurality of vertical charge coupled devices formed between the photo diodes for transferring electric charges generated from the photo diodes in a vertical direction, a horizontal charge coupled device for transferring the electric charges transferred from the vertical charge coupled devices in a horizontal direction, and a sense amplifier for outputting an electric signal by sensing the electric charges transferred in the horizontal direction and outputting an electric signal.

The major drawbacks to the CCD are the complicated driving method and high power consumption. Also, the fabricating method of the CCD is complicated because a multi-level photo process is required.

In addition, it is difficult to integrate a control circuit, a signal processing circuit, an analog/digital (A/D) converter, and other circuits with the CCD. This makes it difficult to reduce a size of a product employing the CCD.

Therefore, a CMOS image sensor has been developed as a next-generation image sensor that can overcome the drawbacks of the CCD.

The CMOS image sensor is a device employing a switching method in which outputs of unit pixels are sequentially detected by MOS transistors, the number of which is identical to that of unit pixels. The MOS transistors are formed on a semiconductor substrate, and a control circuit and a signal processing circuit are used as peripheral circuits.

That is, a photodiode and a MOS transistor are formed in each unit pixel so that the CMOS image sensor realizes an image by sequentially detecting electric signals of the unit pixels using the switching method.

Since the CMOS image sensor uses CMOS fabrication technology, the power consumption is low and the fabrication process is simplified. This simplification can be due to the reduced number of photo processes.

In the CMOS image sensor, because the control circuit, the signal processing circuit, and the A/D converter circuit can be integrated with a CMOS image sensor chip, the size of the product employing the CMOS image sensor can be reduced.

Therefore, the CMOS image sensor has been widely used in a variety of applications such as digital cameras and digital video cameras.

The CMOS image sensor is classified into types according to the number of transistors, such as a 3T-type, 4T-type, 5T-type. For example, the 3T-type CMOS image sensor includes one photodiode and three transistors, and the 4T-type CMOS image sensor includes one photodiode and four transistors. The layout of the unit pixel of the 3T-type CMOS image sensor will now be described.

FIG. 1 is a lay-out of the unit pixel of a conventional 3T-type CMOS image sensor and FIG. 2 is an embodiment of a sectional view taken along line A-A' of FIG. 1, illustrating a photodiode and a transfer transistor of the conventional CMOS image sensor.

As shown in FIG. 1, an active region 10 is defined and one photodiode (PD) 20 is formed on a wide width portion of the active region 10. Gate electrodes 30, 40, and 50 of three transistors are formed to overlap a remaining portion of the active region 10.

That is, a reset transistor (Rx) is formed by the gate electrode 30, a drive transistor. (Dx) is formed by the gate electrode 40, and a select transistor (Sx) is formed by the gate electrode 50.

Impurities are implanted into the active region 10 of the transistors except for the regions below the gate electrodes 30, 40 and 50, thereby forming a source/drain region of each transistor.

A power voltage Vdd is applied to the source/drain region between the reset transistor (Rx) and the drive transistor (Dx). The source/drain region at a side of the select transistor Sx can be connected to a readout circuit (not shown).

The gate electrodes 30, 40 and 50 are connected to respective signal lines (not shown). Each signal line can be provided with a pad connected to an external drive circuit.

According to an embodiment of the section view taken along line A-A' of FIG. 1 as shown in FIG. 2, a P− type epitaxial layer 12 is formed on a $P^{++}$ type semiconductor substrate 11 and incorporates an active region with a photodiode region and a transistor region and an isolation region. An isolation layer 13 is formed on the isolation region.

A gate electrode 15 is formed on a portion of the epitaxial layer 12 in the transistor region for the reset transistor with a gate insulation layer 14 interposed therebetween. An insulation sidewall 16 is formed on both sides of the gate electrode 15.

An n-type diffusion region 19 is formed on the epitaxial layer 12 of the photodiode region PD.

An LLD region 17 and a source/drain impurity region 18 are formed on the transistor region of the semiconductor substrate 11.

Because the CMOS image sensor is an analog device the function of the resistor is important.

For example, a resistor can function to catch a reference voltage and is formed of a poly having a relatively low temperature dependency.

A non-salicided poly silicon is formed to obtain a desired resistance. A middle resister of the conventional CMOS sensor can have a resistance of about 200-800Ω/□(ohm/sq).

In a method for forming the middle resistor, impurities are implanted after a poly gate is formed to form a sheet resistance suitable for a device property. However, according to the prior art, the photodiode 19 can be damaged when the insulation sidewall 16 is formed on the both sides of the gate electrode 15.

That is, the region of the photodiode PD may be primarily damaged by plasma during the process for forming the gate electrode 15 and secondarily damaged by the plasma during the process for forming the insulation sidewall 16.

In order to prevent the plasma damage on the photodiode region when the insulation sidewall is formed, a scheme for forming a nitride layer has been developed. In this case, since the nitride layer remains on the photodiode even when the process is finished, the remaining nitride layer deteriorates the transmittance of the light, thereby making it difficult to scale-down the device.

That is, when the device is scaled-down, the photodiode region is reduced and thus the dynamic range is reduced. As a result, an amount of light incidence is reduced and can make it difficult to reproduce the image.

SUMMARY OF THE INVENTION

Accordingly, the present invention is directed to a CMOS image sensor and method for fabricating the same that can address one or more problems of the related art.

An object of the present invention is to provide a method of fabricating a CMOS image sensor, which can improve a property of the image sensor by preventing a photodiode region from being damaged and reducing a resistance variation of a middle resistor and an image sensor fabricated by such a method.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a method for fabricating a CMOS (complementary metal oxide silicon) image sensor incorporating a semiconductor substrate having a pixel region with a photodiode region and a transistor region, and a middle resistor region, the method including: forming a gate electrode on the pixel region of the semiconductor substrate and, at the same time, forming a polysilicon pattern on the middle resistor region; forming a first lightly doped n− type diffusion region on the photodiode region; forming a second lightly doped n-type diffusion region on the transistor region; consecutively forming a first insulating layer and a second insulating layer on an entire surface of the semiconductor substrate; removing a predetermined portion of the second insulating layer, which was formed on the transistor region and the middle resistor region; forming a third insulating layer on the entire surface of the semiconductor substrate; forming sidewalls incorporating the first insulating layer and the third insulating layer on the gate electrode and the polysilicon pattern by performing an etch-back process; and heavily doping n-type impurities in the transistor region and the polysilicon pattern.

In another aspect of the present invention, there is provided a method for fabricating a CMOS (complementary metal oxide silicon) image sensor, including: providing a semiconductor substrate having a pixel region with a photodiode region and a transistor region, and a middle resistor region; forming a gate electrode on the pixel region of the semiconductor substrate and, at the same time, forming a polysilicon pattern on the middle resistor region; forming a first lightly doped n− type diffusion region on the photodiode region; forming a second lightly doped n− type diffusion region on the transistor region; consecutively forming a first insulating layer and a second insulating layer on an entire surface of the semiconductor substrate; removing a predetermined portion of the second insulating layer; forming a third insulating layer on the entire surface of the resulting structure; and forming sidewalls on the gate electrode and the polysilicon pattern through an etching process.

In still another aspect of the present invention, there is provided a CMOS (complementary metal oxide silicon) image sensor, including: a semiconductor substrate having a pixel region with a photodiode region and a transistor region, and a middle resistor region; a photodiode and a gate electrode formed on the pixel region; a poly silicon pattern formed on the middle resistor region; first and second insulating layers formed on the photodiode region; and sidewalls formed on the gate electrode and the polysilicon pattern.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIGS. 3A through 3J are consecutive sectional views illustrating a method for fabricating a CMOS image sensor according to an embodiment of the present invention;

FIGS. 4A and 4B are sectional views of a CMOS image sensor fabricated through a method according to alternative embodiments of the present invention.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. It will also understood that when a layer is referred to as being "on" another layer or substrate, it can be directly on the other layer or substrate, or intervening layers may also be present.

FIGS. 3A through 3J are consecutive sectional views illustrating a method for fabricating a CMOS image sensor according to an embodiment of the present invention.

Figure 1:
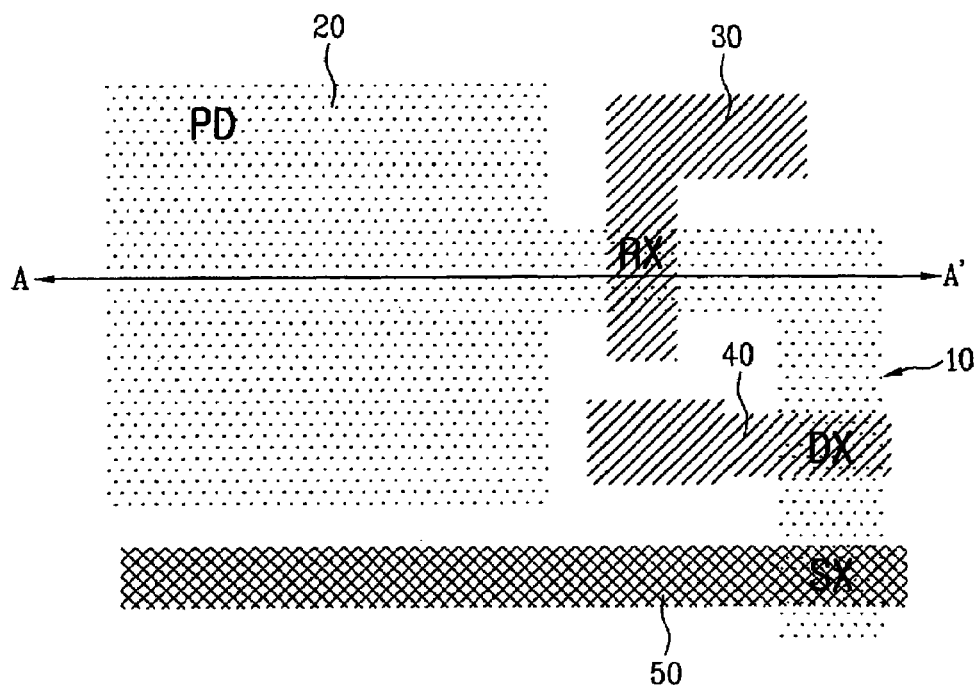
FIG. 1 is a layout view of a unit pixel of a conventional 3T-type CMOS image sensor.
Figure 2:
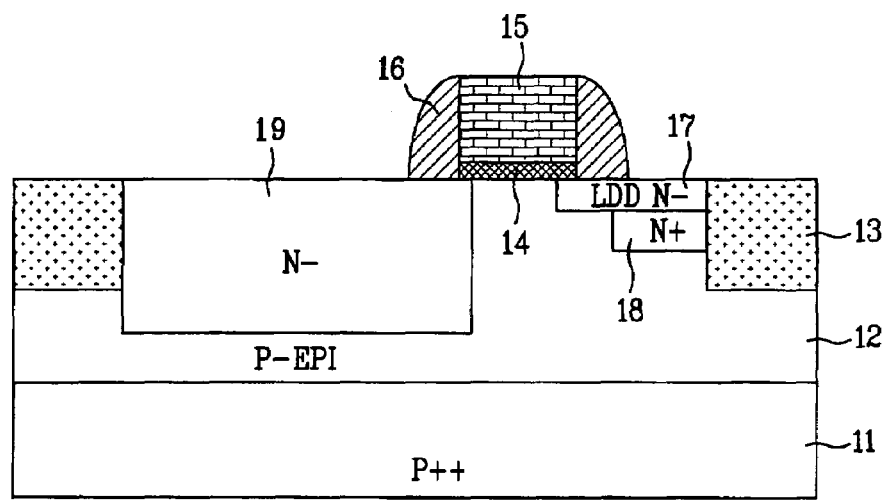
FIG. 2 is a sectional view taken along line A-A' of FIG. 1, illustrating a photodiode and a transfer transistor of the conventional CMOS image sensor.
Figure 3A:
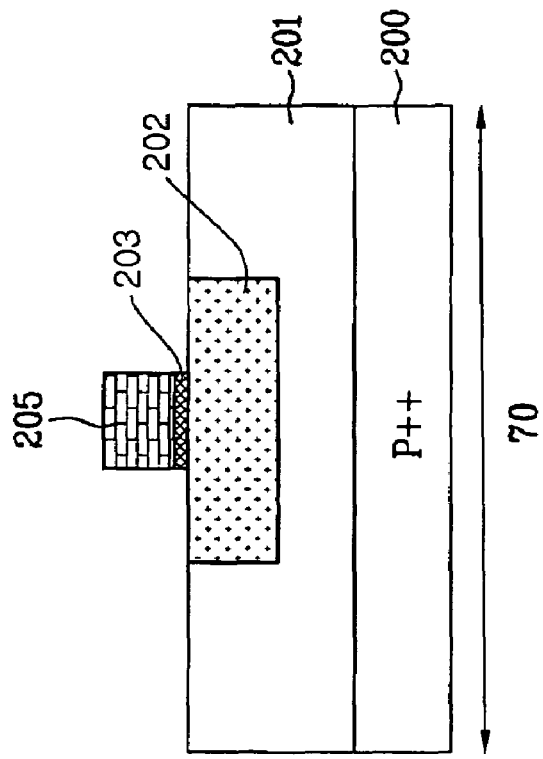
Figure 3A:
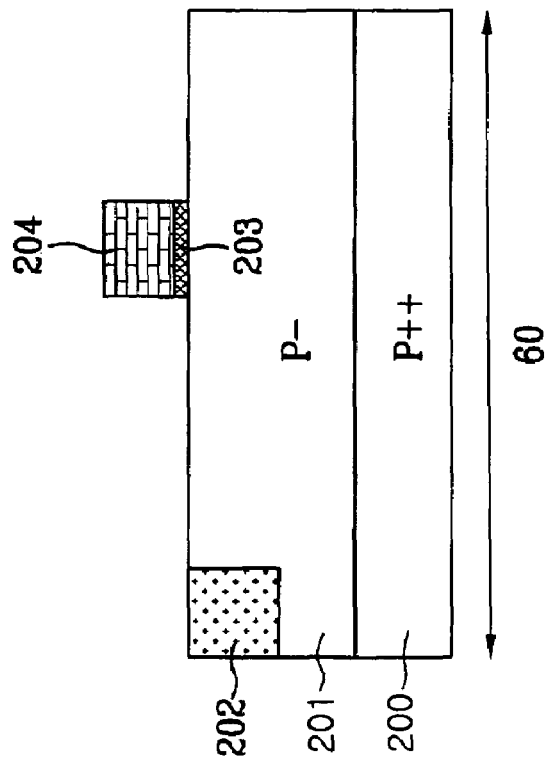

As shown in FIG. 3A, on a $P^{++}$-type semiconductor substrate 200 incorporating a pixel region 60 and a middle resistor region 70 (shown separately) a P− type epitaxial layer 201 can be formed using an epitaxial process.

Here, the epitaxial layer 201 is formed to enhance the ability of a low-voltage photodiode for collecting optical electric charges by forming a wide and deep depletion region, and to improve the photosensitivity of the device.

The pixel region 60 of the semiconductor substrate 200 can be divided into a photodiode region, a transistor region, and an isolation region. In embodiments of the subject invention, an isolation layer 202 can be formed on the isolation region using a STI process or a LOCOS process.

Then, a gate insulation layer 203 and a polysilicon layer are consecutively deposited on the entire surface of the epitaxial layer 201 on which the isolation layer 202 is formed. The polysilicon layer and the gate insulation layer are patterned through photolithography and etching processes such that a gate electrode 204 is formed on each transistor region and a poly silicon pattern 205 is formed on the middle resistor region.

In an embodiment, the gate insulation layer 203 can be formed through a thermal-oxidation process or a CVD process.

Figure 3B:
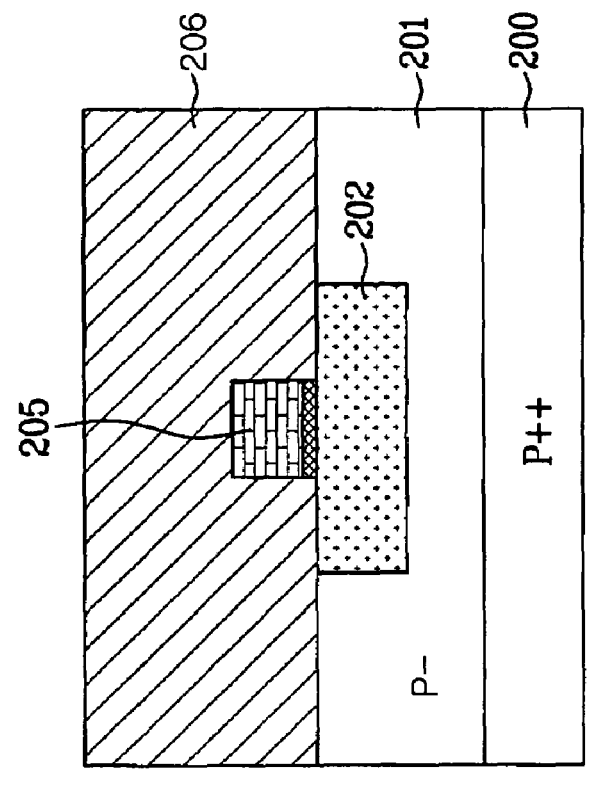
Figure 3B:
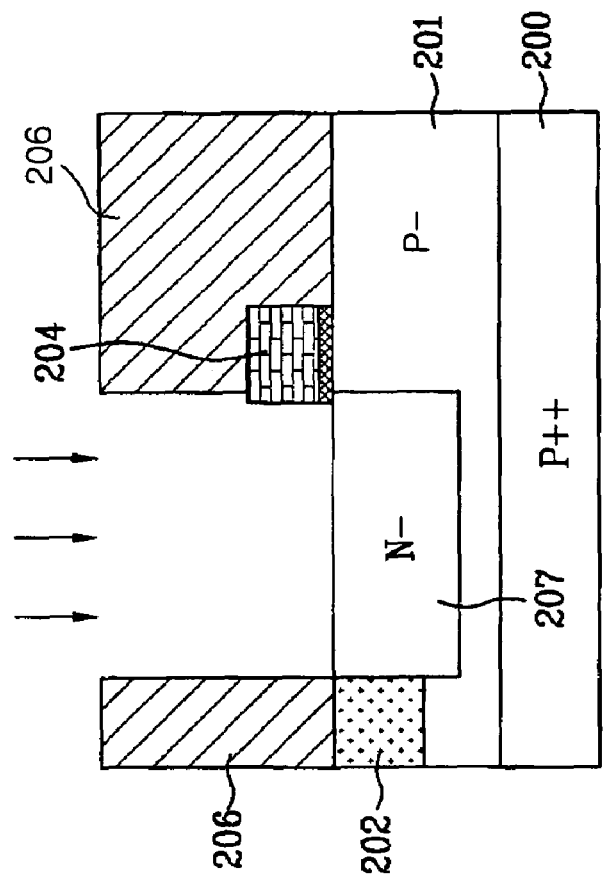

As shown in FIG. 3B, a first photoresist layer 206 is applied on an entire surface of the semiconductor substrate 200 including the gate electrode 204. The first photoresist layer 206 is patterned through exposing and developing processes such that the photodiode region can be exposed. N type impurities are implanted in the epitaxial layer at the exposed photodiode region using the patterned first photoresist layer 206 as a mask to form a first lightly doped n– type diffusion region 207.

Figure 3C:
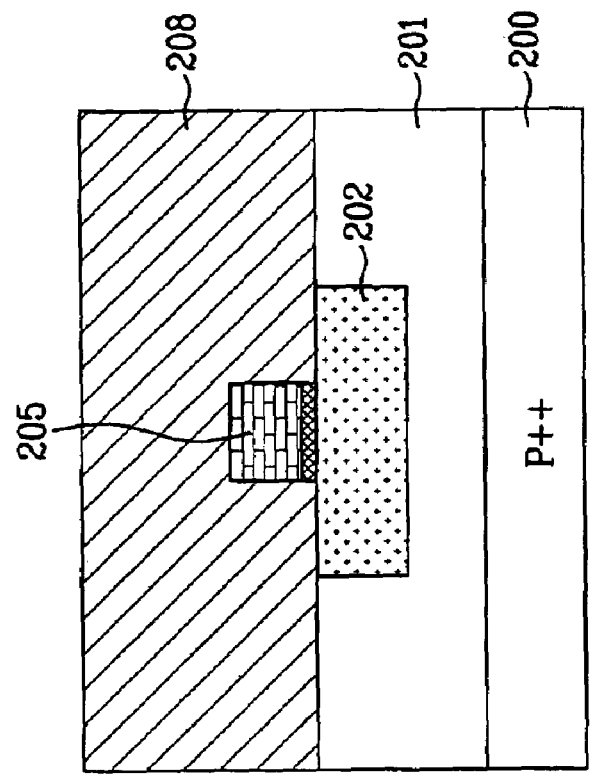
Figure 3C:
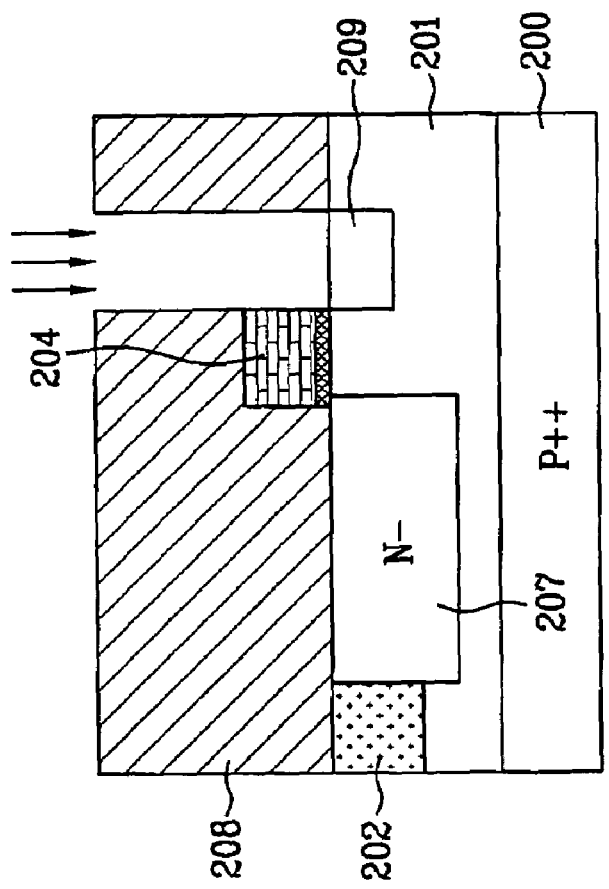

As shown in FIG. 3C, the first photoresist layer 206 is removed and a second photoresist layer 208 is applied on the entire surface of the semiconductor substrate 200. The second photoresist layer 208 is patterned through exposing and developing processes such that the transistor region is exposed.

Then, n– type impurities are implanted in the epitaxial layer 201 at the transistor region using the patterned second photoresist layer 208 as a mask to form a second lightly doped n– type diffusion region 209 on the transistor region.

In a specific embodiment, the impurity doping energy for forming the first n– type diffusion region 207 is higher than that for forming the second n– type diffusion region 209 so that the impurities can be more deeply implanted.

Figure 3D:
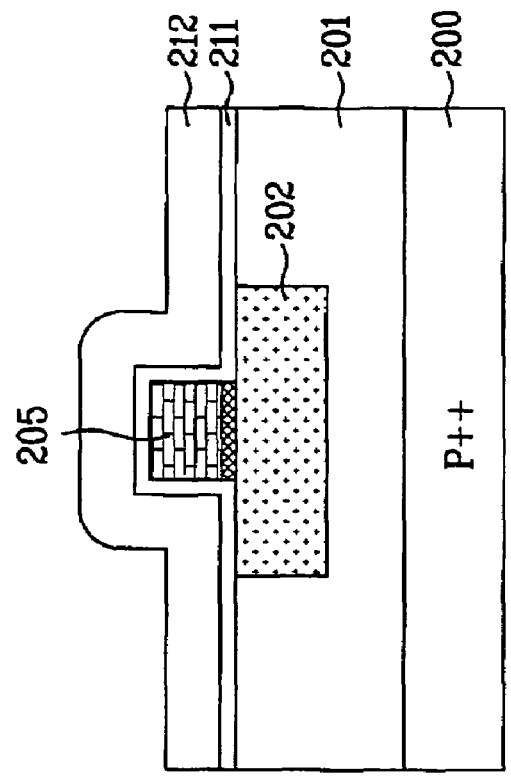
Figure 3D:
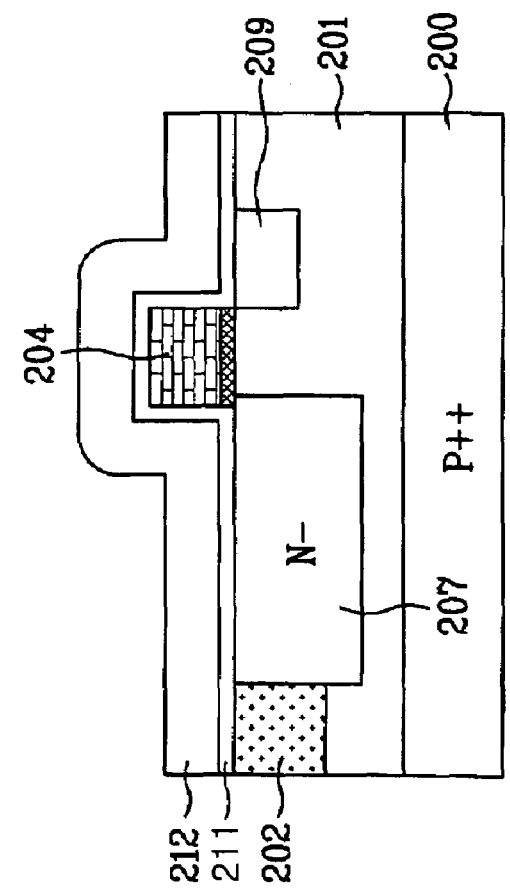

As shown in FIG. 3D, the second photoresist layer 208 is removed and first and second insulating layers 211 and 212 are consecutively formed on the entire surface of the semiconductor substrate 200. In an embodiment, the first and second insulating layers 211 and 212 can be formed through, for example, a pressure chemical vapor deposition process (a low pressure chemical vapor deposition).

The first and second insulating layers 211 and 212 can be formed of oxide layers and/or nitride layers. In a specific embodiment, the oxide layer can be a thermal oxide layer or a TEOS-based oxide layer.

Figure 3E:
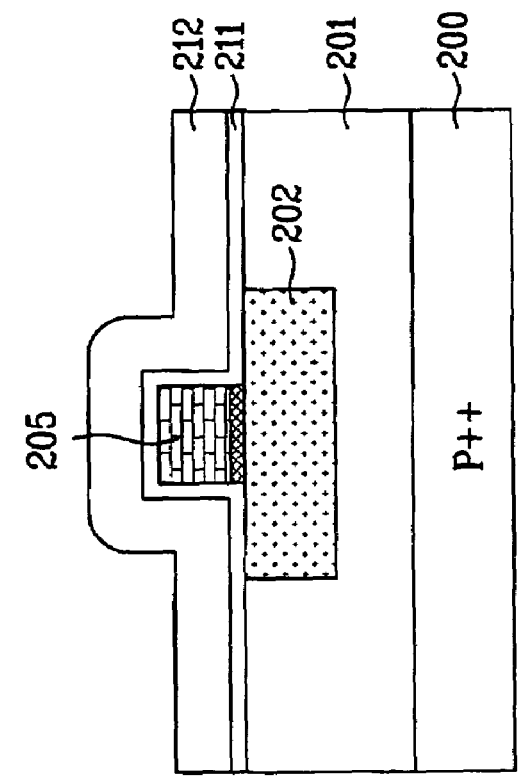
Figure 3E:
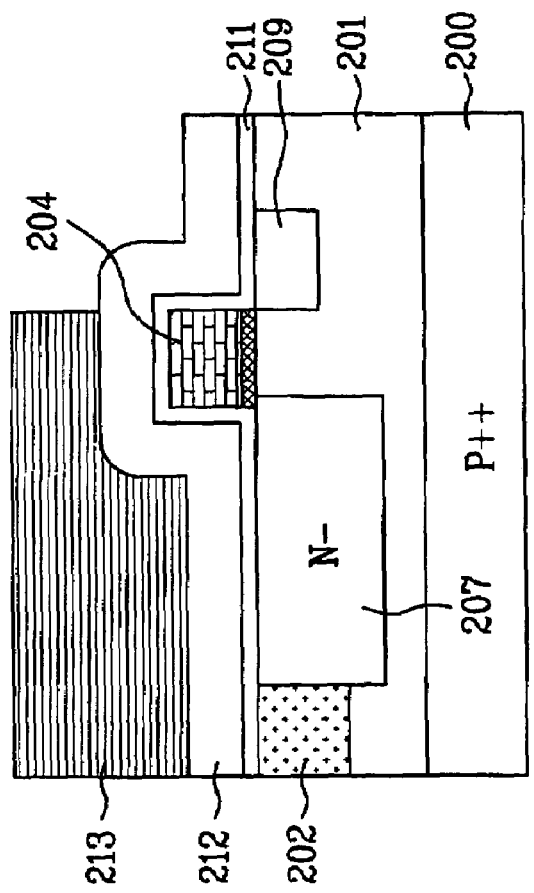

As shown in FIG. 3E, a third photoresist layer 213 is applied to the surface of the substrate 200 on the second insulating layer 212. The third photoresist layer 213 can be patterned through exposing and developing processes such that the transistor region and the middle resistor region are exposed.

Figure 3F:
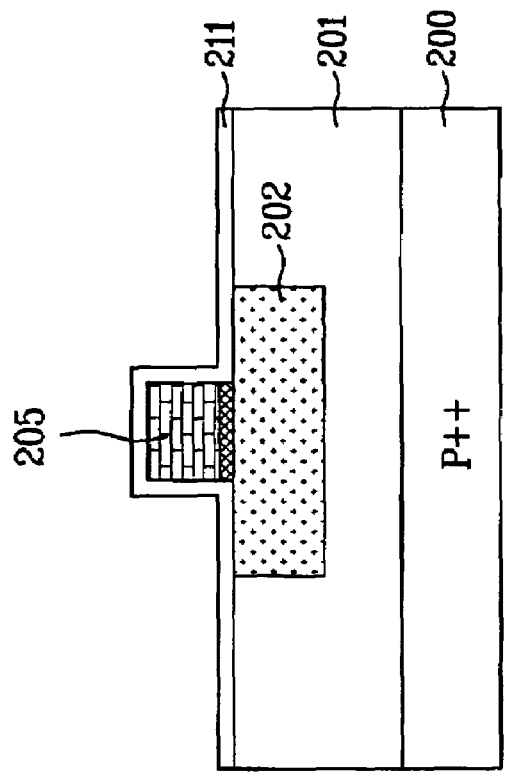
Figure 3F:
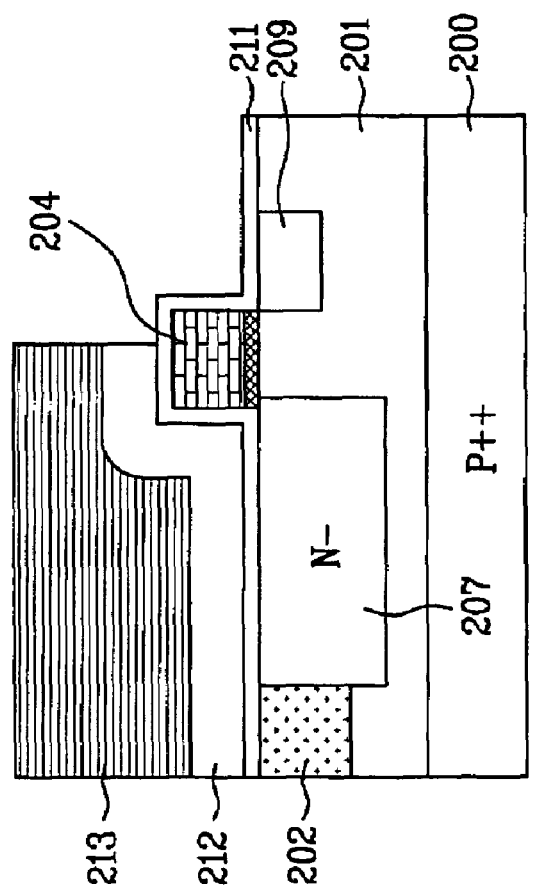

As shown in FIG. 3F, the second insulating layer 212 formed on the transistor and middle resistor regions is removed using the patterned third photoresist layer 213 as a mask.

Figure 3G:
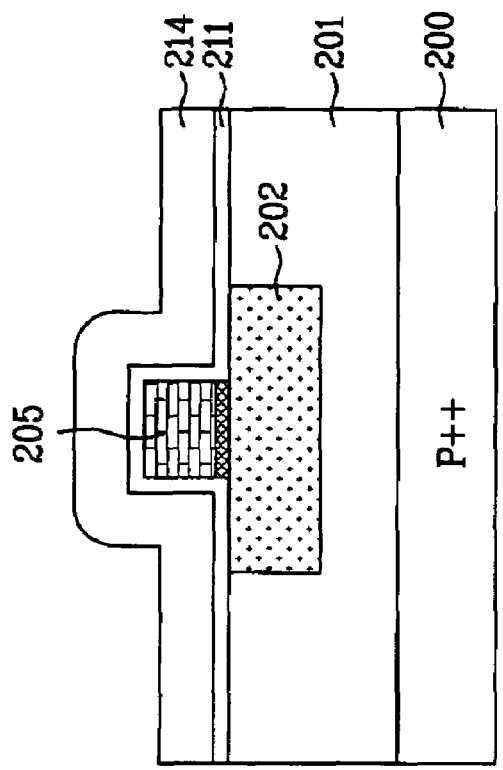
Figure 3G:
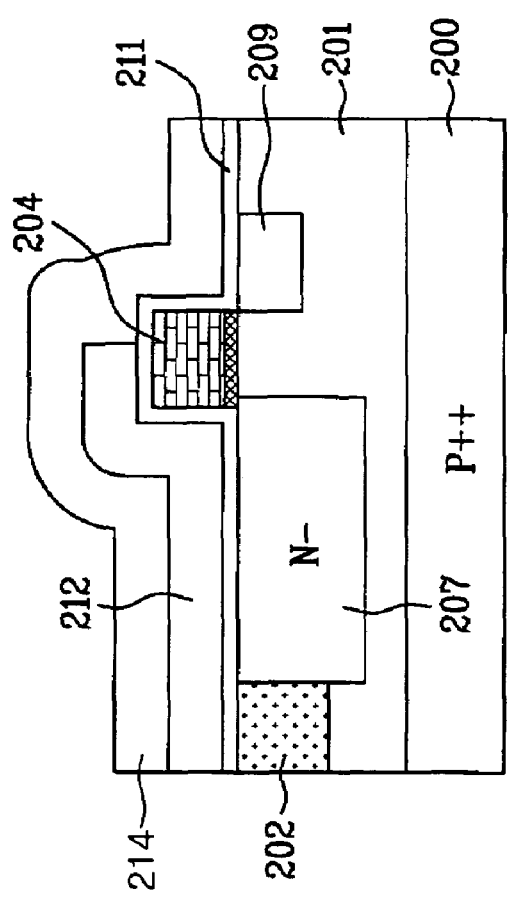

As shown in FIG. 3G, the third photoresist layer 213 is removed and a nitride layer 214 is formed on the entire surface of the semiconductor substrate 200.

Figure 3H:
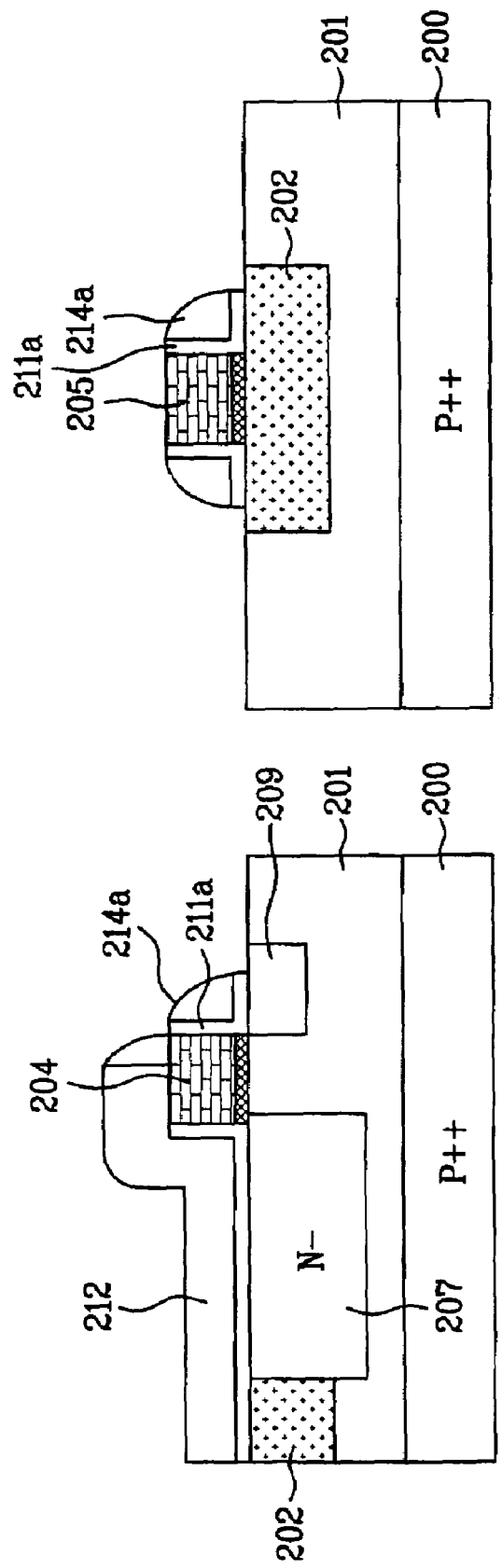

As shown in FIG. 3H, a first nitride sidewall 214a and a first insulating layer sidewall 211a are respectively formed on the transistor and middle resistor regions including a side of the gate electrode 204 by performing an etch-back process for the entire surface of the semiconductor substrate 200.

In the prior art, an etch-back process is performed for the entire surface of the insulating layer such that nitride sidewalls are formed on both sides of the gate electrode and the polysilicon pattern. For the prior art, the photodiode region is damaged by the plasma. However, in the subject embodiments, the first and second insulating layers 211 and 212 can remain on the photodiode region and only the nitride layer 214 formed on the transistor region is etched-back to form the nitride sidewall 214a. As a result, the photodiode region is not damaged as in the prior art.

As shown in FIG. 3I, a fourth photoresist layer 215 is applied on an entire surface of the semiconductor substrate 200 and patterned through exposing and developing processes such that a region where a source/drain impurity region will be formed and the polysilicon pattern 205 of the middle resistor region are opened.

N type impurities are implanted heavily in the region where the source/drain impurity region will be formed using the patterned fourth photoresist layer 215 as a mask to form a highly doped $n^+$ type diffusion region 216.

The n type impurities are also implanted heavily in the poly silicon pattern 205 of the middle resistor region to form the resistor.

Figure 3J:
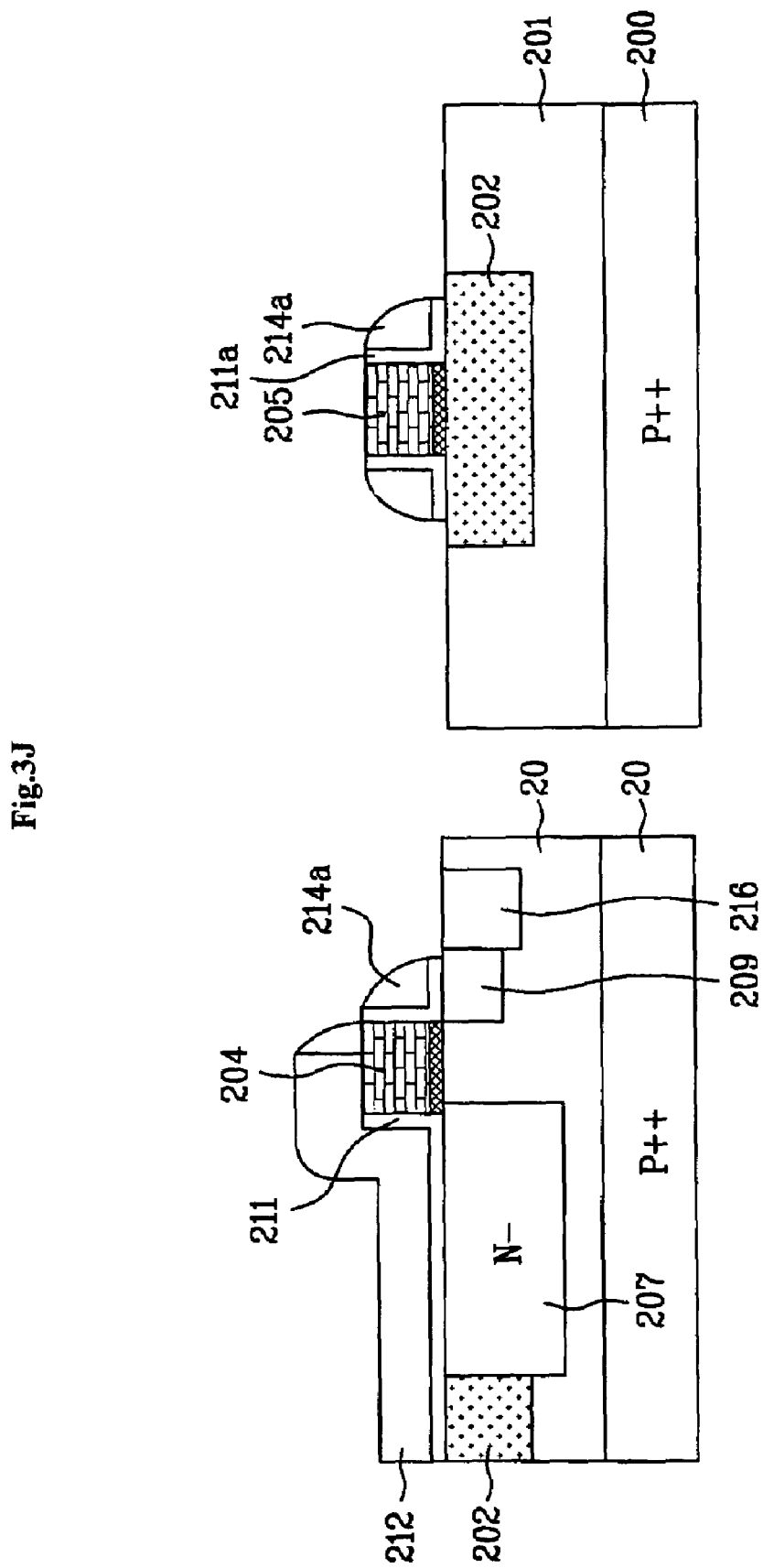

As shown in FIG. 3J, the fourth photoresist layer 215 is removed and a heat treatment process (e.g., rapid heat treatment) can be performed for the semiconductor substrate 200 at a temperature of about 800-1200° C. to diffuse impurity ions in the first and second lightly doped n– type diffusion regions 207 and 209 and the highly doped $n^+$ type diffusion region 216.

Here, the first and second insulating layers 211 and 212 remaining on the photodiode region can be used as anti-salicide insulation layers of the photodiode region.

According to embodiments of the subject invention, because the nitride sidewall 214a is formed while the first lightly doped n– type diffusion region 207 is protected by the insulating layers 211 and 212, the first lightly doped n– type diffusion region 207 does not incur damage.

In addition, since no nitride layer remains on the first n-type diffusion region 207 after the process is finished, the deterioration of the transmittance of the light due to the remaining nitride layer can be prevented.

Figure 4B:
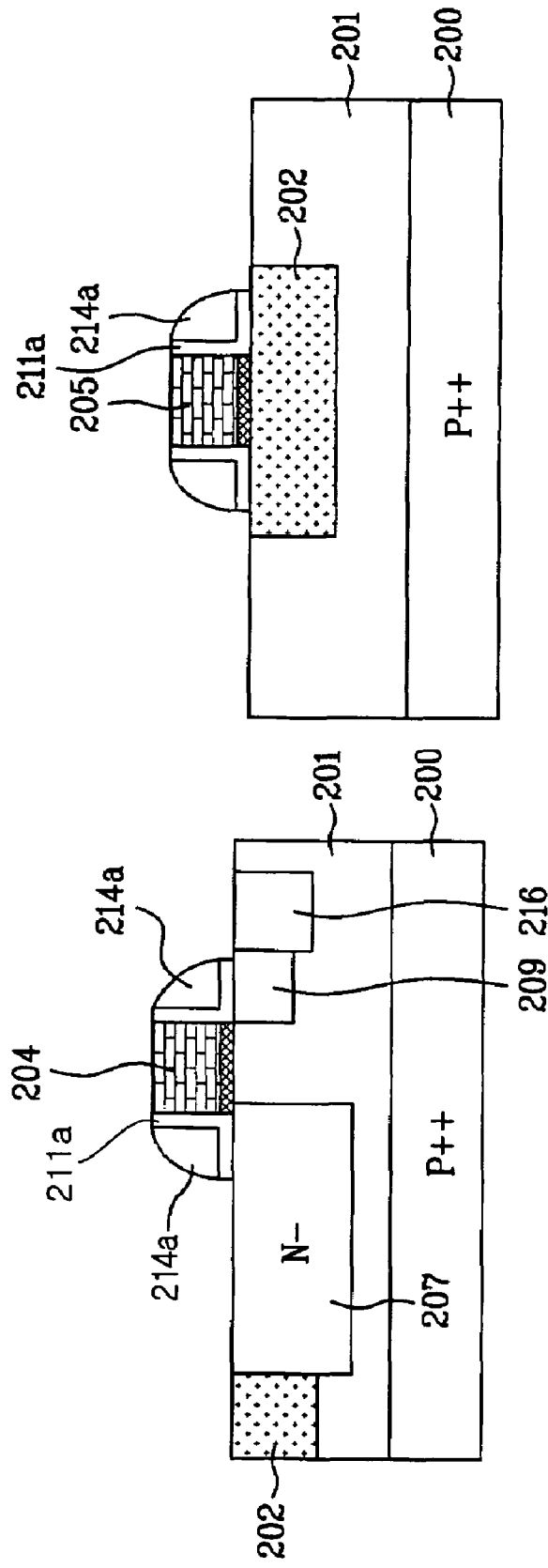

FIGS. 4A and 4B are sectional views of a CMOS image sensor fabricated through a method according to alternative embodiments of the present invention.

As shown in FIG. 4A, after the nitride layer is formed on the entire surface of the semiconductor substrate 200, an etch-back process is performed for the entire surface of the semiconductor substrate 200 to form a nitride sidewall 214a and a first insulating sidewall 211a on one side of a gate electrode 204 of the transistor region and on middle resistor region in a similar method as shown in FIG. 3G.

Then, the first and second insulating layers 211 and 212 remaining on the first n-type diffusion region 207 are removed through an etching process.

Although the first n– type diffusion region 207 can be slightly damaged by the etching process, since no nitride layer is formed on the first n– type diffusion region 207, the deterioration of the light transmittance can be prevented.

Next, a photoresist layer is applied on the semiconductor substrate 200 and patterned through exposing and developing processes such that a region where a source/drain impurity region will be formed and the polysilicon pattern 205 of the middle resistor region are opened.

N type impurities are implanted heavily in the region where the source/drain impurity region will be formed using the patterned fourth photoresist layer 206 as a mask to form a highly doped n+ type diffusion region 216.

The n type impurities are also implanted heavily in the poly silicon pattern 205 of the middle resistor region to form the resistor.

In a further embodiment, the photoresist layer 215 is removed and a heat treatment process (e.g., rapid heat treatment) is performed for the semiconductor substrate 200 at a temperature of about 800-1200° C. to diffuse impurity ions in the first and second lightly doped n– type diffusion regions 207 and 209 and the highly doped n+ type diffusion region 216.

Referring to the embodiment shown in FIG. 4B, when the second insulating layer 212 formed on the transistor and middle resistor regions is removed using the third photoresist layer 213 patterned in FIG. 3E, the second insulating layer 212 is removed such that the second insulating layer no longer covers the gate electrode 204 at the pixel region.

Then, when the nitride layer is formed on the entire surface of the semiconductor substrate 200, a first nitride sidewall 214a and a first insulating layer sidewall 211a are respectively formed on the transistor and middle resistor regions including both sides of the gate electrode 204 by performing an etch-back process for the entire surface of the semiconductor substrate 200.

Then, the first and second insulating layers 211 and 212 remaining on the first n– type diffusion region 207 are removed through an etching process. The subsequent processes can be identical to those described in reference to FIG. 4A.

Figure 5:
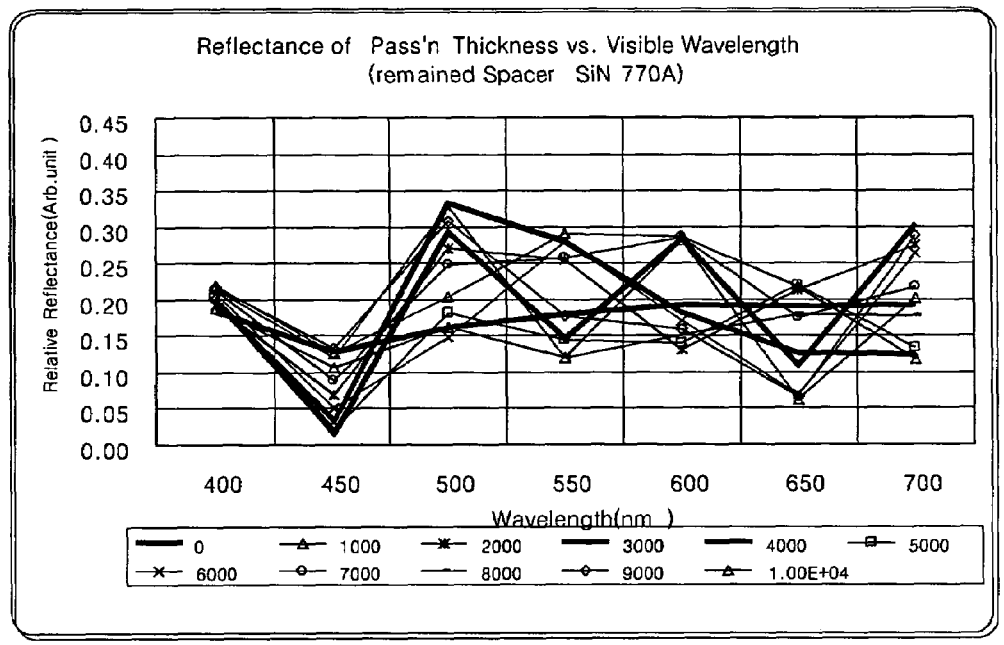
FIGS. 5 and 6 are views illustrating reflectance properties of the inventive and conventional CMOS image sensors, respectively.
Figure 6:
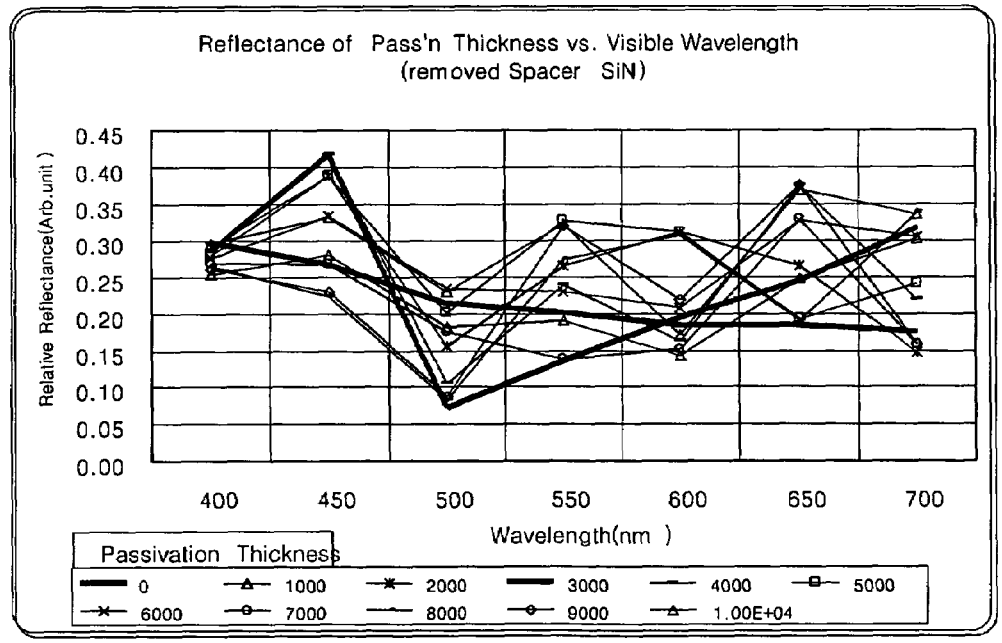

FIGS. 5 and 6 are views illustrating reflective properties of the inventive and conventional CMOS image sensors, respectively.

Referring to FIG. 5, when the photodiode region is damaged or the nitride layer remains, the reflectance of a green region increases, which deteriorates the overall color reproduction.

However, in the present invention, as shown in FIG. 6, since the damage of the photodiode region is prevented and the nitride layer is fully removed, the reflectance of the green region is reduced, which improves the color reproduction.

The above-described methods for fabrication the CMOS image sensor according to the present invention can have the following advantage.

When the sidewall for the gate electrode is formed on the photodiode region, the photodiode region can be protected from the plasma. Thus, the performance of the image sensor can be improved.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method for fabricating a CMOS (complementary metal oxide silicon) image sensor comprising:
    forming a gate electrode on a pixel region of a semiconductor substrate and, at the same time, forming a polysilicon pattern on a middle resistor region of the semiconductor substrate;
    forming a first lightly doped n-type diffusion region on a photodiode region of the pixel region;
    forming a second lightly doped n-type diffusion region on a transistor region of the pixel region;
    consecutively forming a first insulating layer and a second insulating layer on the semiconductor substrate;
    removing a predetermined portion of the second insulating layer from the transistor region and the middle resistor region;
    forming a third insulating layer on the semiconductor substrate;
    forming sidewalls of the first insulating layer and the second insulating layer on the gate electrode and the polysilicon pattern by performing an etch-back process; and
    implanting n-type impurities in the transistor region and the polysilicon pattern.

2. The method according to claim 1, wherein the first insulating layer is an oxide layer or a nitride layer and the second insulating layer is an oxide layer or a nitride layer.

3. The method according to claim 2, wherein the oxide layer is a thermal oxide layer of a TEOS-based oxide layer.

4. The method according to claim 1, wherein the third insulating layer is a nitride layer.

5. The method according to claim 1, wherein removing a first predetermined portion of the second insulating layer removes the second insulating layer such that the second insulating layer covers a portion of the gate electrode.

6. The method according to claim 5, wherein the sidewalls are formed on one side of the gate electrode and both sides of the polysilicon pattern.

7. The method according to claim 1, wherein the sidewalls are formed on one side of the gate electrode and both sides of the polysilicon pattern.

8. The method according to claim 1, further comprising removing the first insulating layer and the second insulating layer from the first lightly doped n-type diffusion region of the photo diode region.

9. A method for fabricating a CMOS (complementary metal oxide silicon) image sensor, comprising:
    providing a semiconductor substrate comprising a pixel region having a photodiode region and a transistor region, and a middle resistor region;
    forming a gate electrode on the pixel region and, at the same time, forming a polysilicon pattern on the middle resistor region;
    forming a lightly doped n-type diffusion region on the photodiode region;
    consecutively forming a first insulating layer and a second insulating layer on the semiconductor substrate;
    removing a predetermined portion of the second insulating layer;
    forming a third insulating layer on the resulting structure; and
    forming sidewalls on the gate electrode and the polysilicon pattern through an etching process.

10. The method according to claim 9, wherein removing a predetermined portion of the second insulating layer removes the second insulating layer that covers one side of the gate electrode and the middle resistor region.

11. The method according to claim 9, wherein the sidewalls are formed on one side of the gate electrode and both sides of the polysilicon pattern.

12. The method according to claim 9, wherein removing a predetermined portion of the second insulating layer removes the second insulating layer that covers the gate electrode and the middle resistor region.

13. The method according to claim 12, wherein the sidewalls arc formed on both sides of the gate electrode and both sides of the polysilicon pattern.

14. The method according to claim 9, wherein the sidewalls are formed by etching the first insulating layer and the third insulating layer.

15. The method according to claim 9, wherein the first insulating layer is an oxide layer or a nitride layer and second insulating layer is an oxide layer or a nitride layer.

16. The method according to claim 15, wherein the oxide layer is a thermal oxide layer or a TEOS-based oxide layer.

17. The method according to claim 9, wherein the third insulating layer is a nitride layer.

18. The method according to claim 9, further comprising removing the first insulating layer and the second insulating layer from the first lightly doped n-type diffusion region of the photo diode region.

* * * * *